Jan. 17, 1967 H. MARTIN ET AL 3,299,328
SEMICONDUCTOR DEVICE WITH PRESSURE CONTACT
Filed April 26, 1963 2 Sheets-Sheet 1

Jan. 17, 1967 H. MARTIN ET AL 3,299,328

SEMICONDUCTOR DEVICE WITH PRESSURE CONTACT

Filed April 26, 1963 2 Sheets-Sheet 2

United States Patent Office 3,299,328

Patented Jan. 17, 1967

3,299,328

SEMICONDUCTOR DEVICE WITH PRESSURE CONTACT

Heinz Martin and Herbert Vogt, Munich, Germany, assignors to Siemens-Schuckertwerke Aktiengesellschaft, Berlin-Siemensstadt, Germany, a corporation of Germany Filed Apr. 26, 1963, Ser. No. 276,061
Claims priority, application Germany, Apr. 28, 1962, S 79,235, S 79,236
19 Claims. (Cl. 317—234)

Our invention relates to electronic solid-state rectifiers, controlled rectifiers and other semiconductor devices of germanium, silicon or intermetallic semiconductor compound of crystalline constitution. More specifically, the invention concerns semiconductor devices in which the electrode-carrying semiconductor member proper is conductively connected with immediately adjacent conductor structure, such as a component of a capsule or heat sink or a terminal conductor, with the aid of mechanical pressure means not requiring soldering or other fusion bonding by heating apt to impair the electric properties or stability of the semiconductor member.

In one of its more particular aspects, our invention relates to improvements of semiconductor devices according to the copending application of R. Emeis and H. Vogt, Serial No. 216,707, filed August 10, 1962, issued November 30, 1965 as Patent No. 3,221,219, and assigned to the assignee of the present invention. These devices comprise a mechanical pressure-contact assembly that permits of lateral gliding motion between the semiconductor member and one or both adjacent metal bodies, thus preventing thermal changes from causing mechanical stresses due to different thermal coefficients of expansion, each two glidably engaged contact surfaces consisting of different metals, preferably nickel and silver, that do not fuse together under the pressures and temperatures occurring during normal operation of the device.

While such pressure-contacted semiconductor devices exhibit improved stability of electrical properties, we have discovered, according to the present invention, that they are amenable to further improvement as regards permanence of properties and reliability of hermetic sealing in cases where the pressure-contacted semiconductor member forms part of a mechanically self-contained unit, such as in a sealed capsule; and it is, therefore, an object of our invention to improve encapsulated semiconductor devices toward jointly higher thermal stability of the semiconductor properties and better hermetic sealing properties, more specific objects of the invention being set forth presently.

According to the above-mentioned copending application, a terminal contact which forms part of the pressure-producing device for the semiconductor member proper is either firmly joined with an inner metallic sleeve of an electrically insulating seal in a capsule, or the terminal contact passes through a sealing sleeve from the interior to the outside of the capsule. The terminal contact is essentially given mushroom shape and is inherently rigid, the broad portion of the mushroom structure being adjacent to a metal surface on the semiconductor member proper to cooperate therewith. Although in such an encapsulated device, differences in thermal elongation do not directly act upon the sensitive semiconductor crystal, any resulting thermal elongation of the terminal contact or the structures connected therewith may cause residual stresses in the semiconductor assembly proper or may impose a detrimental stress upon, and ultimately impair, the electrically insulating seal to which the terminal contact is connected or through which it passes to the outside.

It is among the more specific objects of our invention to prevent the occurrence of such mechanical stresses due to the presence of a terminal contact connecting the semiconductor member mechanically with a housing or sealing structure.

Another more specific object is to achieve such protection from detrimental mechanical forces in a fully encapsulated semiconductor device, generally of the type according to the above-mentioned copending application.

In pressure-contacted semiconductor devices, the necessary pressure between the semiconductor member proper and the adjacent conducting structures is produced and maintained by one or more springs. According to the above-mentioned copending application, a set of disc-shaped springs is coaxially disposed between the semiconductor member and a fixed abutment formed by the housing. Such a set of springs, as a whole, must possess a sufficient amount of elastic yield to take care of the tolerances occurring in the production and assembling of the encapsulated device, but must nevertheless secure the amount of area pressure at the mutually engaging pressure surfaces required for satisfactory operation of the semiconductor member. Although disc-type springs permit storing a relatively high potential energy, they generally have only a slight amount of yielding travel. In order to account for some degree of tolerance in obtaining the desired force-storing action, the set of disc springs may comprise springs of small outer diameter adjacent to the contact member to be pressed against the semiconductor member, as well as springs of larger outer diameter which abut against the housing structure, such as a ring-shaped metal portion of an electrically insulating body that forms part of the insulating seal of the housing. However, a disc-type spring of relatively large diameter still affords only a small amount of yielding travel and thus likewise contributes to imposing an excessive amount of stress upon the semiconductor member and the sealing structure, particularly in the event of an unfavorable coincides of mechanical tolerances of the assembled parts.

It is therefore another object of our invention to provide a semiconductor device of the above-mentioned kind with pressure-spring means that combine a sufficient contact pressure between the semiconductor member and the adjacent metal structures while reliably affording a sufficient amount of elastic yield to take care of the tolerances occurring in practice, and to minimize the strain to which the affected components of the device may become subjected in cases where a combination of unfavorable tolerance conditions happens to be encountered.

According to a feature of our invention, we provide a semiconductor device of the above-mentioned type with a terminal contact consisting of a stem portion and a disc-shaped body of larger diameter joined with the stem at one end thereof and coaxially located adjacent to a contact member to be pressed against the crystalline semiconductor member of the device; and we design the disc body of the terminal contact and the cooperating contact member in such a manner that they have a ring-shaped zone of mutual contact engagement extending about the axis of the stem portion. We further make the inner portion of the disc body thermally deformable elastically in the area surrounded by the ring-shaped zone of contact so that the disc portion of the terminal contact can elastically yield toward and away from the semiconductor member, by correspondingly varying the disc shape in the surrounded area.

The features just mentioned can be embodied in different, more specific structures according to the invention.

Thus, the stem portion of the rigid terminal contact carrying the disc potrion in mushroom-fashion on the stem end near the semiconductor member can be clamped only along an outer marginal zone of the disc portion against a counter-surface of the intermediate contact member that in turn engages the semiconductor member proper. According to a more specific feature relating so such a design, we provide the intermediate contact member within the ring-shaped contact zone with a recess so that the disc portion located within the ring-zone obtains sufficient freedom of elastic motion in the axial direction relative to the surface of the intermediate contact member.

According to another, alternative feature of the invention, we provide the two axially opposite surfaces of the disc body with respective ring-shaped structures or inserts which space the disc relative to its inner portion from the respective clamping abutments so as to provide the desired yieldability of the disc toward and away from the surface of the intermediate contact member.

According to still another feature of our invention, the disc-shaped portion of the otherwise rigid terminal contact has ring-shaped marginal portions along the disc periphery protruding in axially opposite directions respectively so that the disc, with its peripheral bulging margin can directly rest against an abutment carried by the housing, and against the ring-shaped contact zone of the intermediate contact member, respectively. Such a terminal contact can be produced simply by hammering or forging, for example.

In those cases where the disc portion of the terminal contact is provided with intermediate spacer rings or with marginal bulges to act as spacers, the intermediate contact member can be given a particularly simple outer geometrical shape.

According to still another feature, applicable conjointly with the other features of our invention mentioned herein, the disc-shaped portion of the otherwise rigid terminal contact is given a curved cross-sectional shape in the area surrounded by the ring-shaped contact zone, to thereby increase yieldability. For example, this portion of the disc may have a wavy cross section.

According to another feature of our invention, the disc of the terminal contact is pressed, with the aid of an insulating body, against a contact member engaging an electrode of the crystalline semiconductor member. The insulating body is preferably provided with a central hole by means of which it is loosely guided on the stem of the terminal contact. The insulating body is preferably provided on its surface facing away from the disc, with a seat or shoulder to serve as an abutment for at least one force-storing spring which takes care of providing the necessary contact pressure.

The insulating body, thus constituting a pressure-transmitting structure between the spring system and the disc of the terminal contact, is preferably given a cup-shaped recess, the cup bottom being engaged by the disc, whereas the intermediate contact member and the semiconductor member and, if desired, also the carrier of the semiconductor member, are surrounded by the peripheral wall of the insulating cup.

As a result, the inner peripheral surface of the insulating body operates as a gauge or jig which keeps the enclosed components in properly centered position relative to one another and relative to the base plate or top portion of the housing. The same gauge or jig action of the insulating body can be utilized when assembling the semiconductor device to facilitate placing the component parts upon each other in the proper order and thereafter assembling them with the insulating seal or in-lead of the housing and the interposed spring system. In this manner, the mutual connection of the two housing portions, or the connection of a cup-shaped capsule with the outer ring of an insulating and sealing portion of the housing, can more readily be effected.

According to another feature of our invention, the spring system for providing contact pressure between the terminal contact and the semiconductor member comprises at least one spring which is subdivided into a plurality of legs at its engagement with one of the adjacent abutment surfaces. For this purpose, the spring may be given a recess or slot in the middle of its length whose margin or marginal zone rests under pressure against the contact to be forced against the semiconductor member, or rests against the above-mentioned electrically insulating body, which in turn acts against the contact.

According to a feature more specific than the one just mentioned, one or more springs in a device according to the invention are of disc shape and provided with radial slots to secure the desired increase in axial yielding travel. However, a spring body with a closed periphery can also be employed, in which case the shape of the spring is not that of a disc or saucer but of the saddle type. Such a spring possesses a bulging cylindrical surface and need not necessarily have a circular cross section. The marginal portions of the closed peripheral shape are then placed against corresponding localities of the abutment. Such a saddle spring is particularly advantageous for the purposes of the invention because the body available in such a spring for storing potential energy has substantially the character of a ring shape, but the yielding spring travel is considerably larger than obtainable with an ordinary disc-shaped spring for given spacial requirements. Also applicable for the purpose of the invention is a band spring (leaf spring) extending substantially in the diametrical direction relative to the axis of the semiconductor member and having a central recess abutting against the terminal contact or against the insulating body that rests upon the contact, while the leg ends of the band spring (leaf spring) are braced against a portion of the cup-shaped housing or against the outer ring of the insulating sealing or lead-in structure of the capsule.

The above-mentioned and further objects, advantages and features of our invention, said features being set forth with particularity in the claims annexed hereto, will be apparent from, and will be described in, the following with reference to embodiments of semiconductor devices according to the invention illustrated by way of example on the accompanying drawings in which:

Figure 1:
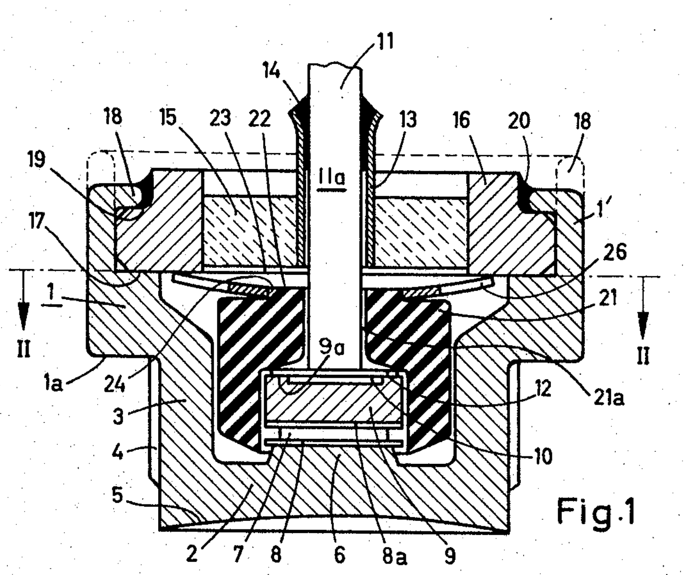
FIG. 1 shows in axial section an encapsulated silicon rectifier diode, the section being taken along the line II—II in FIG. 2.
Figures 2, 5, 6:
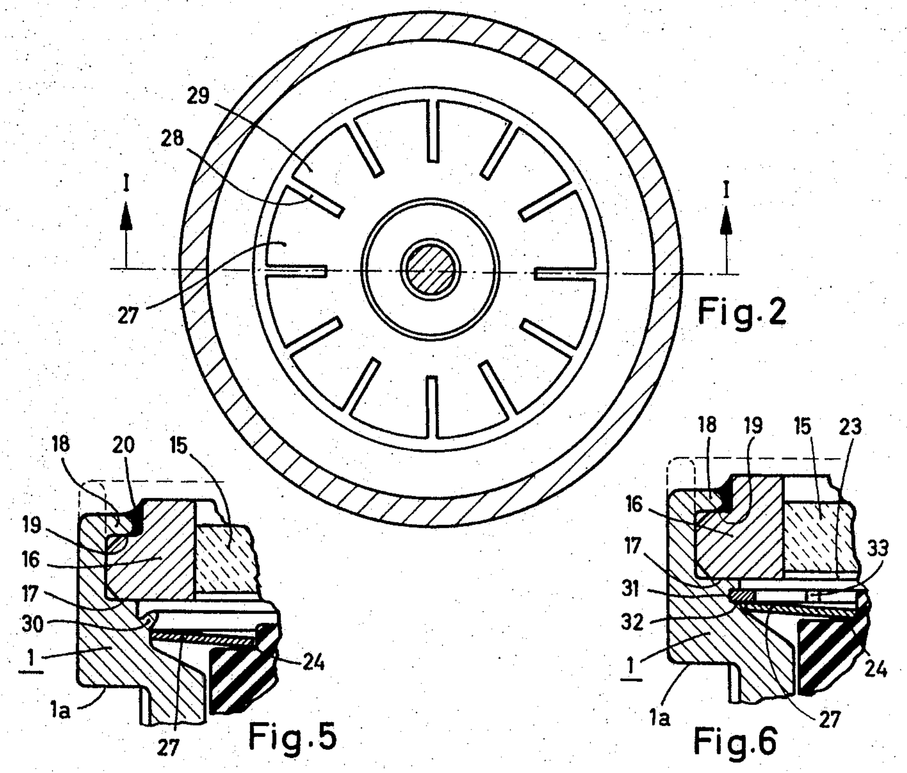
FIG. 2 is a cross section along the line II—II in FIG. 1.
Figure 7:
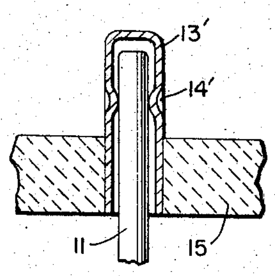
Figure 8:
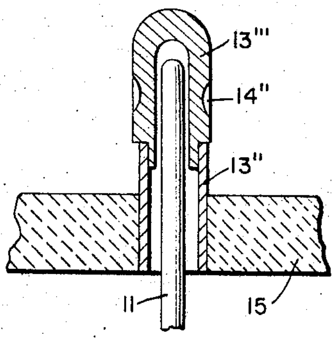

FIGS. 5 and 6 show two further embodiments respectively by partial and sectional views, the devices of FIGS. 3 to 6 being otherwise similar to those of FIGS. 1 and 2; and FIGS. 7 and 8 are partial sectional views of a modified element of the embodiment shown in FIG. 1.

In all illustrations, like parts are designated by the same reference numerals, respectively.

Referring now in detail to the embodiment illustrated in FIG. 1, there is shown a semiconductor device comprising a supporting conductor structure or cup-shaped metallic housing 1 formed, for example, of copper or silver-plated copper. The housing 1 has an upper portion 1′, a bottom portion 2, and an intermediate portion 3, of smaller diameter than the upper portion 1′, extending in the axial direction of the semiconductor element. The outer wall surface of the intermediate portion 3 is preferably formed with ribs 4. The outer surface of the bottom portion 2 has an arcuate concave configuration producing a pan-like curved surface 5. The bottom portion 2 has a raised base 6 on which a semiconductor element 7 is supported or fixed.

The semiconductor element 7 is formed of a circular disc of silicon having electrode coatings on its respective flat sides. The silicon disc is supported on the raised base 6, spaced from the latter by an auxiliary ductile plate 8, for example of silver. Another metallic ductile auxiliary plate 8*a*, which may also consist of silver, is supported on the opposite electrode surface of the semiconductor element 7. The auxiliary plate 8*a* is in engagement with an intermediate connecting body 9 formed, for example of copper. Instead of providing separate auxiliary plates 8 and 8*a*, the surfaces with which these plates are in engagement can be suitably coated, for instance, with a silver layer. Thus, the plate 8*a* may consist of a silver-plated coating on the copper body 9.

In the embodiment illustrated in FIG. 1, the intermediate connecting body 9 has its entire bottom surface in engagement with the auxiliary plate 8*a* and has its top surface provided with a circular, central recess 10, thus forming a ring-shaped contact zone 9*a* around the recess 10. A counter-contact member or terminal conductor 11 having a plate-shaped portion 12 placed upon the upper surface of the intermediate connecting body 9 is provided with a stem or shank 11*a* whose diameter is smaller than that of the recess 10 in body 9. The area of mutual contact between the intermediate connecting body 9 and the plate-shaped portion or disc body 12 for electric current carrying purposes thus corresponds to the area of the annular zone 9*a* on the upper surface of the intermediate connecting body 9. The rigid shank 11*a* of the contact member 11 passes from the semiconductor device through a bushing 13 which forms part of an electrically insulating lead-in assembly described more fully hereinbelow. A gas-tight connection is provided between the flaring end portion of the bushing 13 and the shank 11*a* of the contact member 11 extending therethrough. As illustrated in FIG. 1, such an air-tight or gas-tight connection is achieved by forming a soldered joint 14 between the two bodies. A gas-tight connection can be made also by crimping or compressing the end of bushing 13 against the peripheral surface of the stem or shank 11*a* of the contact member 11. Of course, both of the foregoing means of making the connection gas-tight can be used simultaneously. Furthermore, instead of solder, a suitable adhesive or plastic substance may be used, if desired.

Instead of the outwardly flaring bushing 13 shown in FIG. 1, the insulating lead-in unit, as shown in FIG. 7, may comprise a cap-like metallic body 13′ closed at the top which extends upwardly from the lead-in unit and opening downwardly in a direction facing the inner chamber of the housing 1. When the semi-conductor device is assembled, the free end of the stem 11*a* of the terminal conductor 11 is received in the cap-like body of the modified lead-in unit, and a portion of the closed end of the metallic cap-like body, which is disposed outwardly of the assembled semiconductor device, is clamped securely at 14′ to the stem 11*a* by suitable compressive means. Of course, the metallic cap element need not be of one single piece but rather, as shown in FIG. 8, the insulating lead-in unit may comprise an inner bushing 13″ and a cap-shaped member 13‴ either inserted partially into or fitted partially around the inner bushing at its upper end which projects from the assembled device, the cap-shaped member being fixed to the upper end of the inner bushing by a hard solder, for example.

The electrically insulating lead-in assembly shown in FIG. 1 comprises a glass body 15 in the embodiment of FIG. 1, although a ceramic insulating body also may be used. Surrounding the glass body 15 is a metal ring 16. Due to the construction of the insulating pressure-glass lead-in structure and by making the component parts of materials having suitable expansion coefficients, the respective parts will differently shrink when cooling during production of the device, so that the glass body 15 becomes subjected to a compressive stress. Thus, the glass body is prestressed, to such an extent as to exclude the occurrence of tensile stresses in the glass body 15 due to the temperatures prevailing when subsequently the completed semiconductor device is in operation and traversed by normal operating current. This reliably prevents the formation of cracks and fissures and the resulting leakage otherwise apt to be caused by tensile stresses in the insulating lead-in seal.

In the embodiment according to FIG. 1, the outer ring 16 of the insulating lead-in unit is supported upon a shoulder 17 formed in the cup-shaped housing 1. In addition, an extended portion 18 of the cup-shaped housing 1, initially in the position indicated by the broken lines, surrounds the peripheral surface of the ring 16. After assembling the semiconductor device, the extended portion 18 is bent inwardly from the dotted-line position shown in FIG. 1 by means of a rolling or beading process so that it forms an annular flange which engages a shoulder 19 of the ring 16, thereby clamping the ring 16 against the shoulder 17, as indicated in full lines in FIG. 1. Solder 20 or any other suitable sealing substance is then applied at the joint between the ring 16 and the bent extended portion 18.

An insulating body 21, having a cup-like configuration and a central aperture or bore 21*a* through which it is mounted on the shank or shaft 11*a* of the contact member 11, is formed with an internal shoulder 21*b* surrounding the bore 21*a* and engages the upper surface of the plate-shaped portion 12 of the contact member 11. The insulating body 21 has side walls 21*c* which extend around the intermediate connecting body 9 and the semiconductor element 7 as well as its end electrode plates 8, 8*a*. A portion 22 of reduced diameter on the insulating body 21 provides a central bearing or mounting means for a biasing spring 23 which bears against the annular shoulder 22*a* surrounding the offset portion 22, and exerts the required pressure through the insulating body 21 to maintain engagement between the enlarged disc member 12 and the intermediate connecting body 9 and between the latter and the pole plate 8*a* of the semiconductor element 7.

Figure 3:
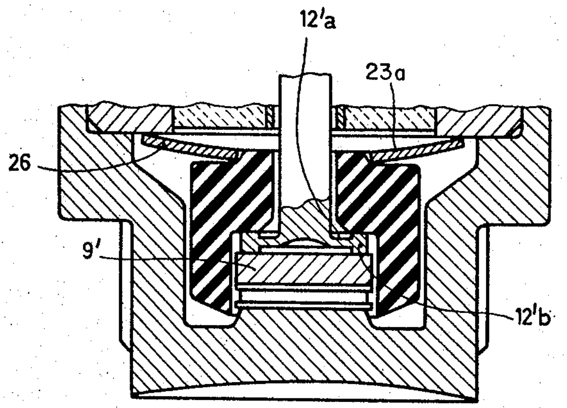
FIGS. 3 and 4 illustrate two further embodiments respectively by partial sectional views corresponding to FIG. 1.

The biasing spring may be in the form of a saddle spring 23*a*, such as is shown in FIG. 3, having extension portions 25, 26 which can undergo a relatively large deflection and thus store a considerable amount of kinetic energy. The spring 23*a* is formed with a central aperture 24 which fits on the offset portion 22 of the insulating body 21. The portions 25, 26 of the spring 23*a* bear against the outer ring 16 of the electrical insulating lead-in unit. If the embodiment of FIG. 3 were viewed in plan, it would be noted that the central aperture 24 of the saddle spring 23*a* has a shape other than that of a perfect circle, for example rectangular, which corresponds to a similar exterior shape of the offset portion 22 so as to prevent relative rotation between the spring and the offset portion when the semiconductor device is assembled.

The insulating body 21, made of glass, ceramic or other suitable insulating material, has a generally inverted cup shape. The inner dimension of the cup-shaped insulating body 21 is large enough to encompass the elements extending between the elongated stem 11*a* and a portion of the seat 6 which forms part of the base-plate bottom portion 2 of the cup-shaped housing 1. The insulating body 21 consequently maintains these elements in predetermined position relative to one another. The component elements within the cup of the insulating body 21 are also centered by that body in the housing. For this purpose the outer dimension of the insulating body 21 is substantially equal to the inner dimension of the cup-shaped housing 1 at its intermediate reduced portion 3.

The semiconductor device is assembled by placing the lead-in unit 13–16 upon a suitable base support (not shown) having a recess adapted to accommodate the lower part of the metallic bushing 13 (i.e. the upper end thereof as shown in FIG. 1) and subsequently securing the bushing to the lead-in unit in the central aperture thereof by, for example press-fitting the glass body 15 thereon, so that a portion of the bushing 13 extends out of the lead-in unit and into the recess of the base support. The spring 23 is then placed on the lead-in unit so that its central aperture is aligned with the bore of the bushing 13, and the insulating body 21 is superimposed thereon with its bore 21a also in alignment with the aperture of the spring 23 and bore of the bushing 13. Subsequently, the stem 11a of the terminal conductor 11 is then easily inserted through the apertures of the insulating body 21, the spring 23 and the bushing 13, followed by the ready superimposition thereon of the contact member 9, the electrode plate 8a, the semiconductor element 7 and the electrode plate 8 within the cup of the insulating body 21. The insulating body 21 constitutes a gauge or jig upon which the cup-shaped housing 1 is then installed in an upside-down position, as compared to FIG. 1 of the drawings, the seat 6 of the base portion 2 resting on the electrode element 8 and the annular projection 18 being in close engagement with the outer periphery of the ring 16. The assembly is then inverted to the position shown in FIG. 1, pressure being applied to the lead-in unit in a downward direction so that the ring 16 abuts the shoulder 17 in the cup-shaped housing 1 and, with suitable counter pressure being applied against the surface 1a of the cup-shaped housing 1 in an upward direction, the edge portion of the projection 18 is then bent around and pressed against the shoulder 19 of the ring 16 so as to clamp the casing 1 and the casing cover or lead-in unit 13–16 together against the shoulder portion 17 of the casing 1. As this clamping force is exerted, the spring body 23 is automatically subjected to a corresponding biasing force establishing close mutual engagement between the insulating body 21, the disc-shaped body 12 of the terminal contact 11, the contact member 9, the electrode 8, the semiconductor element 7, the second electrode 8a and finally the seat 6 of the base-plate portion 2, assuming, of course, that any of the elements, such as 8a and 8, have not been previously secured by plating to any of the surfaces with which they have contact, in which case, of course, they are in the closest possible engagement with the corresponding contact surface. As a final step, the gap between the bushing 13 and the stem of the terminal conductor 11 is provided with a gas-tight seal by introducing therein a sealing substance 14 consisting of solder, an adhesive substance or any other suitable material, it also, however, being possible to deform bushing 13 by crimping it against and around the stem 11a of the terminal contact 11 as described hereinabove.

Instead of a saddle spring such as is shown in FIG. 3 of the drawings, a bell- or dish-type spring 23, such as is illustrated in FIGS. 1 and 2, may be employed. The dish-type spring 23 has a central aperture in which the stem 11a of the terminal conductor 11 is received, and is formed with a plurality of radially extending slots 28 which define a plurality of springy leg portions 29.

It is not absolutely necessary to use the outer ring 16 of the insulated lead-in unit as supporting or abutment element for the spring 23 or 23a. It is also possible to brace the extremities of the spring directly against a part of the cup-shaped housing 1 in which the semiconductor element is received and with which the casing cover or plate-shaped electrically insulating lead-in unit 13–16 is mechanically connected. FIGS. 5 and 6 show fragmentary cross sections of the device of this invention showing two variations of such a modification in the cup-shaped housing 1.

In FIG. 5, an inwardly projecting edge portion 30 is provided on the inner side walls of the casing 1 below the shoulder 17 against which the insulating lead-in unit 13–16 is clamped. The peripheral edge or the extreme end of the legs of the spring is accordingly caused to bear against the lower surface as seen in FIG. 5 of the inwardly projecting edge portion 30, i.e. the surface which faces the closed end of the cup-shaped casing 1. The projection 30 may either be an integral part of the casing as shown in FIG. 5 or may, for instance as shown in FIG. 6, comprise a snap ring 32 secured in an annular recess 31, formed in the inner wall of the cup-shaped housing 1. The snap ring 32 thus constitutes the abutment or support for the outer peripheral edge or outer ends of the resilient arms of the spring 23, 23a. As shown in FIG. 6, the lower surface of the cup-shaped housing 1 is formed with the annular recess or groove 31 below the shoulder 17 of the cup-shaped housing 1. The snap ring 32 is shown in recess 31 as having a gap 33 therein for permitting compression of the spring and removal thereof if it should be necessary to disassemble the semiconductor device.

In order to assemble the embodiments of FIGS. 5 and 6 respectively, an operation must be performed after the spring is received in the cup-shaped housing 1, without the lead-in unit extending over the stem of the terminal contact 11. As to the embodiment shown in FIG. 5, the spring must be depressed downwardly as shown in FIG. 5 as much as possible to permit a cutting or deforming of the inner wall of the cup-shaped housing 1 so as to cause the annular projection or annularly spaced projections to extend inwardly and to form an obstruction to prevent retraction of the spring 23, 23a. In the embodiment of FIG. 6, the spring and its assembly are similarly depressed, in the absence of the lead-in unit 13–16, below the annular groove 31 and then the snap ring is inserted and permitted to expand within the groove, thus limiting the retraction of the spring. However, as has been noted above, the snap ring 32 is of course removable for permitting the components within the cup-shaped housing 1 to be diassembled.

The inwardly projecting edge portion 30 shown in FIG. 5 may also be preformed as an integral part of the housing 1 before assembly of the semiconductor device. In that case, however, two recesses or apertures must be provided therein through which the spring may be introduced into the housing before the lead-in unit 13–16 is installed. After the spring is introduced into the housing, it is then turned about its axis so that it faces the lower surface of the inwardly projecting edge portion 30 as seen in FIG. 5; thereby constituting a bayonet-type joint with that portion.

Figure 4:
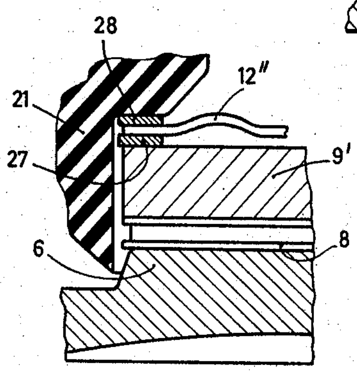

In FIGS. 3 and 4, there are shown two modifications of the terminal contact 11 of the device of this invention. Instead of the flat disc-shaped body 12 secured to the stem of the embodiment shown in FIG. 1, the disc-shaped body 12'a of the embodiment of FIG. 3 has two annular or ring-shaped peripheral bulges 12'b which define the zone of contact engagement with the contact member 9'.

In the modified embodiment of FIG. 4 there is shown a partial view of a disc-shaped body 12" whose edge portion is received between two rings 27 and 28 along the outer periphery thereof. The outer peripheral edge portion of the rings may of course be formed in such a manner as to permit adjustment with respect to the disc-shaped body 12". The disc-shaped body 12" of the embodiment of FIG. 4 has a wavy cross-sectional shape for increasing its yieldability and resilience.

It will also be noted that, whereas the contact member 9 employed in the embodiment of FIG. 1 might just as readily be used with the embodiments illustrated in FIGS. 3 and 4, it is not necessary to have a contact member of such complex configuration for the particularly modified disc-shaped bodies 12' and 12", but that a simple cylindrical or parallelepipedal form such as shown at 9' in FIGS. 3 and 4 may also be employed.

One of the important features of the invention is the prevention of the development of undesirable tensile stresses caused by temperature changes in a semiconductor element. This is positively effected by employing a rigid connection between the intermediate contact member 9 and the terminal conductor 11. In the case of the embodiment of FIG. 1, the rigid connection is effected by sandwiching the peripheral edge of the resilient disc-shaped body 12 between the annular ridge surrounding the recess 10 of the contact member 9 and the internal annular shoulder 21*b* of the insulating body 21. Thermal expansion in the axial direction of the contact member 11 greater than that of the coaxial components causes flexing of the disc 12 downwardly into the recess 10 in the contact member 9. In the case of the embodiments of FIGS. 3 and 4, the central portion of the disc-shaped bodies 12′*a*, 12″ is spaced from the upper surface of the contact member 9′ by the bulge 12′*b* and the ring 27, respectively. Consequently, changes in temperature permit the central part of the aforementioned disc-shaped body 12′*a* and 12″ to yieldably approach and move away from the surface of the intermediate contact member, thereby similarly avoiding the formation of undesirable tensil stresses.

A futher feature of the invention is the concave form of the outer bottom surface 5 in the base-plate portion 2 of the cup-shaped housing 1. In the event the base-plate portion of the semiconductor device is installed in a receptacle (not shown) adapted for receiving the same, to such a depth that the upper edge of the receptacle abuts the shoulder 1*a* of the cup-shaped housing 1, an excessive force may occur and tend to cause deformation of the upper portion 1′ of the cup-shaped housing 1 radially inwardly. Due to the provision of the concave surface 5 at the base, the resulting deformation of the bottom portion 2 would then invariably be in a direction towards the hollow inner space of the cup-shaped body 1, rather than outwardly and downwardly. Such inwardly directed deformation has the advantage that a further biasing action of the spring means within the device takes place. This protects the device and desirably increases the mutual pressure engagement of the components of the semiconductor device in the housing.

By virtue of the intermediate connecting body 9, 9′, a satisfactory current transfer thereto from all parts of the semiconductor element 7 is ensured, so that the surfaces of the semiconductor element and the interior of the semiconductor body are subjected to electrical stresses that are distributed as evenly as possible. It is essential for the intermediate connecting body 9, 9′ which is made of highly electrically conducting material that the current therefrom be conducted via a suitable transfer surface having a permissible electrical resistance to a further conductor in the direction of current flow. In order to establish such a transfer surface, a ring or bulging portion 12′*b* and 27 can be used by means of which the disc-shaped bodies 12′*a*, 12″, respectively, which form part of the terminal conductor 11, are pressed against the intermediate connecting contact 9′. This is feasible inasmuch as by duly selecting the inner and outer dimensions of the ring or bulging portion the transfer surface can readily be given such an area that the specific electrical stress exerted thereon is within permissible limits so that no undue voltage drop can occur at the surface and no excessive amount of Joule's heat is developed. The same current-transfer area simultaneously forms a path for the dissipation of the heat generated in the semiconductor element during the operation thereof, such heat being conducted to other elements functioning as heat sinks.

It is also convenient for the purposes of the invention to provide seating surfaces or shoulders on the rings 27, 28 or bulges 12′*b*, respectively, in order to secure the proper orientation of the annular disc bodies. A similar effect is achieved by providing the outer periphery of the rings or bulges with corresponding projections or with suitable bent or raised portions or flanges, with the object of thereby ensuring a positive mutual space relationship between the intermediate contact member 9′ and the clamping rings 27, 28 on the one hand and bulging portions 12′*b* of the disc 12′*a* of the connecting piece or terminal conductor 11, on the other hand.

It has been found that suitable dimensions for the disc-shaped portion of the rigid connecting contact piece or disc-shaped body 12, 12′*a*, 12″ are, for instance, in the order of 0.1 to 0.3 mm., if the inner diameter of the clamping zone is approximately between 3 and 6 mm. Obviously, the present invention is fundamentally also adapted to be used in conjunction with larger diameter values for the intermediate contact member and correspondingly larger semiconductor bodies.

The biasing spring employed in the embodiments of the invention is preferably so designed and rated that it comprises arm portions which are adapted to cover a relatively significant deflection path during the operation of the semiconductor device. Even in cases where certain variation in the dimensions and arrangement of the component elements of the semiconductor element occur, which may be due to some slight inadvertency during assembly of the device, there is nevertheless assurance that the potential energy stored in the spring during the assembly of the semiconductor device will always be sufficient to allow for satisfactory operation thereof. Therefore, the spring is preferably so selected that, as it is being biased, arm-like portions thereof become bendingly deflected a greater amount than the spring deflection achieved by the use of one or several cup springs which allow only for a relatively slight spring deflection, although they are capable of storing a relatively high potential energy.

For providing such augmented spring deflection in the biasing system of the invention, the deflectable arms of the spring should be as long as feasible. That is, the extreme edges of the arms are preferably located at a position of support most remote from the axis of the semiconductor element.

While the invention has been illustrated as embodied in a semiconductor device, we do not intend to be limited to the details shown, since various modifications and structural changes may be made without departing in any way from the spirit of the present invention. All possible adaptations of the present invention should and are intended by us to be comprehended within the meaning and range of equivalents of the following claims.

We claim:

1. A semiconductor device, comprising a gas-tight housing, a semiconductor member having a metallic electrode surface mounted in said housing, an intermediate contact member of metal whose thermal coefficient of expansion differs from that of said semiconductor member, said contact member having a surface in fusion-resistant face-to-face gliding contact with said electrode surface, a terminal conductor having an elongated stem and a disc body of larger diameter than said stem located coaxially at one end of said stem adjacent to said contact member on the side facing away from said semiconductor member, said disc body and said contact member having a ring-shaped zone of mutual contact engagement extending about the axis of said stem, the portion of said disc body surrounded by said zone being flexible in the direction of said axis in response to thermal elongation of said terminal conductor, and pressure means for applying pressure only to said ring-shaped zone portion of said disc body in the direction of said axis so as to hold said conductor forced toward said semiconductor member.

2. A semiconductor device, comprising a gas-tight housing, a supporting conductor structure located within said housing and having a contact surface, a semiconductor member having two electrode surfaces of which one is in glidable contact engagement with said contact surface, an intermediate contact member in face-to-face glidable contact with said other electrode surface, a terminal conductor having an elongated stem and a disc body of larger diameter than said stem located coaxially at one end of said stem adjacent to said contact member on the side facing away from said semiconductor member, said disc body and said contact member having a ring-shaped zone of mutual contact engagement extending about the axis of said stem, the portion of said disc body surrounded by said zone being flexible in the direction of said axis in response to thermal elongation of said terminal conductor, and pressure spring means mounted between said supporting conductor structure and said disc body for applying pressure only to said ring-shaped zone portion of said disc body in the direction of said axis so as to hold said disc body forced toward said structure.

3. A semiconductor device according to claim 2, comprising ring-shaped insert means coaxially engaging a marginal zone of said disc body and interposed between said body and at least one of said contact member and spring means.

4. A semiconductor device, comprising a gas-tight housing, a semiconductor member having a metallic electrode surface mounted in said housing, an intermediate contact member of metal whose thermal coefficient of expansion differs from that of said semiconductor member, said contact member having a surface in fusion-resistant face-to-face gliding contact with said electrode surface, a terminal conductor having an elongated stem and a disc body of larger diameter than said stem located coaxially at one end of said stem adjacent to said contact member on the side facing away from said semiconductor member, said contact member having a recess axially facing said disc body and of smaller diameter than said body whereby said disc body forms a marginal ring-shaped zone of contact with said contact member, the portion of said disc body surrounded by said zone being flexible axially of said recess in response to thermal elongation of said terminal conductor, and pressure means for holding said conductor forced toward said semiconductor member.

5. A semiconductor device, comprising a gas-tight housing, a semiconductor member having a metallic electrode surface mounted in said housing, an intermediate contact member of metal whose thermal coefficient of expansion differs from that of said semiconductor member, said contact member having a surface in fusion-resistant face-to-face gliding contact with said electrode surface, a terminal conductor having an elongated stem and a disc body of larger diameter than said stem located coaxially at one end of said stem adjacent to said contact member on the side facing away from said semiconductor member, said disc body and said contact member having a ring-shaped zone of mutual contact engagement extending about the axis of said stem, the portion of said disc body surrounded by said zone being flexible in the direction of said axis in response to thermal elongation of said terminal conductor, said disc body being circular and having two ring-shaped peripheral bulges protruding in axially opposite directions respectively, one of said bulges defining said zone of contact engagement, whereby said two bulges form spacing means for permitting said disc portion to flex when said terminal conductor is thermally elongated, and pressure means for holding said conductor forced toward said semiconductor member.

6. In a semiconductor device according to claim 1, said surrounded portion of said disc body having a wavy cross-sectional shape for increased yieldability of said disc body.

7. A semiconductor device according to claim 1, comprising a body of insulating material interposed between said pressure means and said terminal conductor and in pressure transmitting engagement with the ring-shaped zone of said disc body.

8. A semiconductor device, comprising a gas-tight housing, a supporting conductor structure located within said housing and having a contact surface, a semiconductor member having two electrode surfaces of which one is in glidable contact engagement with said contact surface, an intermediate contact member in face-to-face glidable contact with said other electrode surface, a terminal conductor having an elongated stem and a disc body of larger diameter than said stem located coaxially at one end of said stem adjacent to said contact member on the side facing away from said semiconductor member, said disc body and said contact member having a ring-shaped zone of mutual contact engagement extending about the axis of said stem, the portion of said disc body surrounded by said zone being flexible in the direction of said axis in response to thermal elongation of said terminal conductor, a cup-shaped and axially apertured body of insulating material surrounding said stem and having an inner cup bottom in annular engagement with said contact member on the side away from said semiconductor member, and pressure spring means in biasing engagement with said cup-shaped body for forcing said latter body against said contact member.

9. A semiconductor device according to claim 8, wherein said supporting contact structure forms part of said housing, said intermediate contact member and said semiconductor member being received in said cup-shaped insulating body, and said cup-shaped body being engageable with said housing for centering said members in said housing.

10. A semiconductor device according to claim 8, wherein said supporting contact structure forms part of said housing, said intermediate contact member and said semiconductor member being received in said cup-shaped insulating body, and said cup-shaped body having an outer peripheral surface engageable with an inner surface of said housing for centering said members.

11. In a semiconductor device according to claim 1, said pressure means comprising at least one spring and forming two abutment surfaces between which said spring is mounted and stressed, said spring being subdivided at least at its engagement with one of said abutment surfaces into a plurality of springy leg portions.

12. A semiconductor device, comprising a gas-tight housing, a semiconductor member having a metallic electrode surface mounted in said housing, an intermediate contact member of metal whose thermal coefficient of expansion differs from that of said semiconductor member, said contact member having a surface in fusion-resistant face-to-face gliding contact with said electrode surface, a terminal conductor having an elongated stem and a flexible disc body of larger diameter than said stem located coaxially at one end of said stem and having a peripheral ring-shaped zone in contact engagement with said contact member, and pressure means for applying pressure only to said ring-shaped zone portion of said disc body in the direction of the axis of said stem so as to hold said conductor forced toward said semiconductor member, said pressure means comprising at least one spring and forming two abutment surfaces between which said spring is mounted and stressed, said spring being subdivided at least at its engagement with one of said abutment surfaces into a plurality of springy leg portions.

13. A semiconductor device, comprising a gas-tight housing, a semiconductor member having a metallic electrode surface mounted in said housing, an intermediate contact member of metal whose thermal coefficient of expansion differs from that of said semiconductor member, said contact member having a surface in fusion-resistant face-to-face gliding contact with said electrode surface, a terminal conductor having an elongated stem and a flexible disc body of larger diameter than said stem located coaxially at one end of said stem and having a peripheral ring-shaped zone in contact engagement with said contact member, and pressure means for applying pressure only to said ring-shaped zone portion of said disc body in the direction of the axis of said stem so as to hold said conductor forced toward said semiconductor member, said pressure means comprising a spring and forming two abutment surfaces between which said spring is mounted and stressed, said spring being dish-shaped, centrally apertured and surrounding said stem, and said spring having slits extending radially inwardly from the periphery so as to form a plurality of springy leg portions.

14. A semiconductor device, comprising a gas-tight housing, a supporting conductor structure located within said housing, a semiconductor member having two electrode surfaces of which one is in contact engagement with said structure, a contact member in contact engagement with said other electrode surface, a terminal conductor having an elongated stem and a flexible disc body of larger diameter than said stem located coaxially at one end of said stem and having a peripheral ring-shaped zone in contact engagement with said contact member, at least one of said engagements being glidable in the contacting plane, and pressure means for applying pressure only to said ring-shaped zone portion of said disc body in the direction of the axis of said stem so as to hold said conductor forced toward said semiconductor member, said pressure means comprising a spring and forming two abutments between which said spring is mounted and stressed, said spring having an annular shape coaxially surrounding said stem and bulging convexly toward said disc body, and said spring having radial slits extending inwardly from the periphery to form springy leg portions.

15. A semiconductor device, comprising a gas-tight housing, a semiconductor member having a metallic electrode surface mounted in said housing, an intermediate contact member of metal whose thermal coefficient of expansion differs from that of said semiconductor member, said contact member having a surface in fusion-resistant face-to-face gliding contact with said electrode surface, a terminal conductor having an elongated stem and a flexible disc body of larger diameter than said stem located coaxially at one end of said stem and having a peripheral ring-shaped zone in contact engagement with said contact member, pressure means for applying pressure only to said ring-shaped zone portion of said disc body in the direction of the axis of said stem so as to hold said conductor forced toward said semiconductor member, and housing means for receiving the foregoing members and means, said pressure means comprising a leaf spring and forming two abutment surfaces between which said spring is mounted and stressed, one of said abutment surfaces being a surface of said housing means.

16. A semiconductor device, comprising a gas-tight housing, a semiconductor member having a metallic electrode surface mounted in said housing, an intermediate contact member of metal whose thermal coefficient of expansion differs from that of said semiconductor member, said contact member having a surface in fusion-resistant face-to-face gliding contact with said electrode surface, a terminal conductor having an elongated stem and a flexible disc body of larger diameter than said stem located coaxially at one end of said stem and having a peripheral ring-shaped zone in contact engagement with said contact member, pressure means for applying pressure only to said ring-shaped zone portion of said disc body in the direction of the axis of said stem so as to hold said conductor forced toward said semiconductor member, a housing receiving said foregoing elements and means therewithin, and a housing cover secured to said housing, said pressure means comprising a saddle spring and forming two abutment surfaces between which said spring is mounted and stressed, one of said abutment surfaces being a surface of said housing cover.

17. A semiconductor device, comprising a gas-tight housing, a semiconductor member having a metallic electrode surface mounted in said housing, an intermediate contact member of metal whose thermal coefficient of expansion differs from that of said semiconductor member, said contact member having a surface in fusion-resistant face-to-face gliding contact with said electrode surface, a terminal conductor having an elongated stem, and a flexible disc body of larger diameter than said stem located coaxially at one end of said stem and having a peripheral ring-shaped zone in contact engagement with said contact member, pressure means for applying pressure only to said ring-shaped zone portion of said disc body in the direction of the axis of said stem so as to hold said conductor forced toward said semiconductor member, housing means for receiving the foregoing members and means, said housing means having an inner surface, and at least one projection extending inwardly from the inner surface of said housing means, said pressure means comprising a spring and forming a pair of abutments between which said spring is mounted and stressed, said inwardly extending projection being one of said abutments.

18. A semiconductor device according to claim 17, wherein said inwardly extending projection is integral with said housing means.

19. A semiconductor device, comprising a gas-tight housing, a semiconductor member having a metallic electrode surface mounted in said housing, an intermediate contact member of metal whose thermal coefficient of expansion differs from that of said semiconductor member, said contact member having a surface in fusion-resistant face-to-face gliding contact with said electrode surface, a terminal conductor having an elongated stem, and a flexible disc body of larger diameter than said stem located coaxially at one end of said stem having a peripheral ring-shaped zone and in contact engagement with said contact member, pressure means for applying pressure only to said ring-shaped zone portion of said disc body in the direction of the axis of said stem so as to hold said conductor forced toward said semiconductor member, housing means enclosing the aforesaid members and means, said housing means having an inner surface, said inner surface being formed with an annular recess, and a snap ring received in the recess of said housing, and pressure means comprising a spring and forming a pair of abutments between which said spring is mounted and stressed, said snap ring being one of said abutments.

References Cited by the Examiner

UNITED STATES PATENTS

| | | | |
|---|---|---|---|
| 2,712,619 | 7/1955 | Zetwo | 317—234 |
| 2,806,187 | 9/1957 | Boyer et al. | 317—234 |
| 2,956,214 | 10/1960 | Herbst | 317—234 |
| 2,993,153 | 7/1961 | Wagner | 317—234 |
| 3,059,157 | 10/1962 | English et al. | 317—234 |
| 3,065,390 | 11/1962 | Boswell et al. | 317—234 |

FOREIGN PATENTS

| | | |
|---|---|---|
| 207,950 | 3/1960 | Austria. |
| 929,594 | 7/1947 | France. |
| 1,205,743 | 8/1959 | France. |
| 1,233,357 | 5/1960 | France. |
| 614,355 | 12/1948 | Great Britain. |

RICHARD M. WOOD, *Primary Examiner.*

R. F. STAUBLY, *Assistant Examiner.*